(12) United States Patent
Dussaigne et al.

(10) Patent No.: US 12,342,661 B2
(45) Date of Patent: Jun. 24, 2025

(54) METHOD FOR MANUFACTURING A SUBSTRATE COMPRISING A RELAXED INGAN LAYER AND SUBSTRATE THUS OBTAINED FOR THE RESUMPTION OF GROWTH OF A LED STRUCTURE

(71) Applicants: COMMISSARIAT À L'ÉNERGIE ATOMIQUE ET AUX ÉNERGIES ALTERNATIVES, Paris (FR); CENTRE NATIONAL DE LA RECHERCHE SCIENTIFIQUE, Paris (FR)

(72) Inventors: Amélie Dussaigne, Grenoble (FR); Benjamin Damilano, Paris (FR); Carole Pernel, Grenoble (FR); Stéphane Vezian, Paris (FR)

(73) Assignees: COMMISSARIAT À L'ÉNERGIE ATOMIQUE ET AUX ÉNERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 446 days.

(21) Appl. No.: 17/805,539

(22) Filed: Jun. 6, 2022

(65) Prior Publication Data

US 2022/0393065 A1    Dec. 8, 2022

(30) Foreign Application Priority Data

Jun. 7, 2021   (FR) ...................................... 2105989

(51) Int. Cl.
*H10H 20/815*    (2025.01)
*H10H 20/01*     (2025.01)
(Continued)

(52) U.S. Cl.
CPC ...... *H10H 20/815* (2025.01); *H10H 20/0137* (2025.01); *H10H 20/812* (2025.01); *H10H 20/825* (2025.01)

(58) Field of Classification Search
None
See application file for complete search history.

(56) References Cited

U.S. PATENT DOCUMENTS

2009/0140274 A1\* 6/2009 Wierer, Jr. ........... H10H 20/018
                                                            257/97
2015/0318436 A1\* 11/2015 Heo .................... H10H 20/825
                                                            438/46

(Continued)

FOREIGN PATENT DOCUMENTS

EP       3840016 A1    6/2021
EP       3840065 A1    6/2021

OTHER PUBLICATIONS

Jang, Lee-Woon et al. "Electrical and structural properties of GaN films and GaN/InGaN light-emitting diodes grown on porous GaN templates fabricated by combined electrochemical and photoelectrochemical etching" Journal of Alloys and Compounds, 2014, No. 589, pp. 507-512.

(Continued)

*Primary Examiner* — Sue A Purvis
*Assistant Examiner* — Jordan M Klein
(74) *Attorney, Agent, or Firm* — Chrisman Gallo Tochtrop LLC

(57) ABSTRACT

A method for manufacturing a relaxed epitaxial InGaN layer from a GaN/InGaN substrate comprising the following steps: a) providing a first stack comprising a GaN or InGaN layer to be porosified and a barrier layer, b) transferring the GaN or InGaN layer to be porosified and the barrier layer to a porosification support, in such a way as to form a second stack, c) forming a mask on the GaN or InGaN layer to be (Continued)

porosified, d) porosifying the GaN or InGaN layer through the mask, e) transferring the GaN or InGaN porosified layer and the barrier layer to a support of interest, f) forming an InGaN layer by epitaxy on the barrier layer, whereby a relaxed epitaxial InGaN layer is obtained.

10 Claims, 3 Drawing Sheets

(51) Int. Cl.
H10H 20/812 (2025.01)
H10H 20/825 (2025.01)

(56) References Cited

U.S. PATENT DOCUMENTS

2021/0193870 A1* 6/2021 Pernel ............. H10H 20/01335
2021/0193873 A1* 6/2021 Pernel ............. H10H 20/8252

OTHER PUBLICATIONS

Search Report for French application No. FR2105989 dated Mar. 14, 2022.
Even, A. et al., "Enhanced In incorporation in full InGaN heterostructure grown on relaxed InGaN pseudo-substrate", Applied Physics Letters, 2017, vol. 110, pp. 262103-1-262103-5.
Pasayat, Shubhra S. et al., "Compliant Micron-Sized Patterned InGaN Pseudo-Substrates Utilizing Porous GaN", Materials, 2020, vol. 13, No. 213, pp. 1-10.
Pasayat, Shubhra S. et al., "Demonstration of ultra-small (<10 μm) 632 nm red InGaN micro-LEDs with useful on-wafer external quantum efficiency (>0.2%) for minidisplays", Applied Physics Express, 2021, vol. 14, pp. 011004-1-01004-4.
Damilano, et al., "Photoluminescence properties of porous GaN and (Ga, In)N/GaN single quantum well made by selective area sublimation" Optics Express, 2015, vol. 25, pp. 33243-33249.
Coulon, Pierre-Marie et al. "Influence of the reactor environment on the selective area thermal etching of GaN nanohole arrays" Scientific Reports 10 (2020). https://doi.org/10.1038/s41598-020-62539-1.

* cited by examiner

METHOD FOR MANUFACTURING A SUBSTRATE COMPRISING A RELAXED INGAN LAYER AND SUBSTRATE THUS OBTAINED FOR THE RESUMPTION OF GROWTH OF A LED STRUCTURE

CROSS-REFERENCE TO RELATED APPLICATIONS

This application claims priority from French Patent Application No. 2105989 filed on Jun. 7, 2021. The content of this application is incorporated herein by reference in its entirety.

TECHNICAL FIELD

The present invention relates to the general field of colour micro-displays.

The invention relates to a method for manufacturing a substrate or a pseudo-substrate comprising a relaxed InGaN layer.

The invention also relates to a substrate or a pseudo-substrate comprising a relaxed InGaN layer.

The invention has applications in many industrial fields, and in particular in the field of colour micro-displays with a micro-LED base with a pitch less than 10 μm.

PRIOR ART

Colour micro-displays comprise red, green and blue pixels (RGB pixels).

Blue and green pixels can be manufactured with a nitride material base and red pixels with a phosphor material base. To combine these three types of pixels on the same substrate, the so-called "pick and place" technique is generally used. However, in the case of micro-displays with pixels less than 10 μm, this technique can no longer be used because, not only, of the alignment problems, but also the time required to carry out such a technique on the scale of a micro-display.

Another solution consists of carrying out the conversion of colours with quantum dots (QD) or nanophosphors. However, controlling the deposition of these materials on pixels of small dimensions is difficult and their resistance to the flux is not sufficiently robust.

It is therefore crucial to be able to obtain the three pixels RGB natively with the same family of materials and on the same substrate. For this, InGaN is the most promising material. This material can, indeed, theoretically cover the entire visible spectrum according to its concentration in indium. The bleu micro-LEDs with an InGaN base already show a high luminance, much higher than their organic counterparts. To transmit at wavelengths in the green, the quantum wells (QWs) of the LED have to contain at least 25% indium and for a transmission in the red, it is necessary to have at least 35% indium. Unfortunately, the quality of the InGaN material beyond 20% In is degraded due to the low miscibility of In in GaN, but also due to the high compressive stress inherent in the growth of the zone active InGaN on GaN.

It is therefore essential to be able to reduce the global stress in structures with a GaN/InGaN base.

To overcome this problem, several solutions have been considered.

A first solution consists of forming nanostructures, such as nanowires or pyramids, to be able to relax the stresses by the free edges. The growth of the axial nanowires can be carried out by molecular beam epitaxy (MBE). In practice, the low growth temperature used in growth by MBE leads to low internal quantum efficiencies (IQE). The pyramids make it possible to curve the dislocations. In particular, complete pyramids have semi-polar planes that are favourable to the incorporation of In and to the reduction of the internal electrical field of the active zone. For truncated pyramids, the truncated faces allow for a growth of the quantum wells on the plane c, which leads to a more homogeneous transmission with respect to a transmission along semi-polar planes of a complete pyramid. Alternatively, the growth can also be done in planar on planes other than the face c of the wurtzite structure such as the growth on the semi-polar planes that are favourable to the incorporation of In.

Another solution consists of reducing the stresses in the active zone of the LED structure by using a substrate (or pseudo-substrate) with a lattice parameter closer to the lattice parameter of the InGaN alloy of the quantum wells. Thus, even with a planar configuration, the rate of incorporation of In in the InGaN can be increased. It has been shown that, when the lattice parameter of the substrate increases, the internal electrical field is reduced and the transmissions of the quantum wells are offset to the red. The relaxed InGaN layer obtained makes it possible to grow a III-N heterostructure by metal organic vapour phase epitaxy (MOVPE). However, to date, as far as we know, the only substrate that has made possible this demonstration is the InGaNOS pseudo-substrate of Soitec. It is manufactured by implementing the Smart Cut™ technique. The relaxation of the InGaN layer is obtained through different thermal treatments [1]. However, with such a method, cracks can appear in the InGaN layer and/or the surface of this layer can lose its flatness.

Recently, it has been shown that the porous GaN could be compliant [2]. A $In_xGa_{1-x}N$ layer with $0.05 \leq x \leq 0.125$ of 200 nm is formed on an n-doped GaN layer of 800 nm, then mesas of a side of 10 μm are structured. Porosification by electrochemical anodising of the n-type GaN layer leads to a partial relaxation of the upper InGaN layer. Red micro-LEDs with an EQE of 0.2% were able to be elaborated from a similar method [3].

However, with such a method the layer to be porosified has to be doped. In addition, the porosification is done solely by the lateral faces of the mesas. It is therefore difficult to obtain a uniform porosity throughout the entire volume of the GaN layer.

The manufacture of a relaxed epitaxial InGaN layer from a GaN/InGaN substrate and the manufacture of a relaxed epitaxial InGaN layer on InGaN mesas were carried out with methods implementing an electrochemical porosification. The step of porosification is solid plate implemented thanks to different transfers [4,5].

Another technique for porosifying a GaN layer consists of depositing a nano-mask on the GaN layer to be porosified and of sublimating this layer through the openings of the mask thanks to a high-temperature anneal. The size of the pores and their density therefore depend firstly on the dimensions of the mask. Devices comprising a porous GaN layer and quantum wells (Ga, In)N/GaN were manufactured from a stack comprising successively a silicon support, an AlN layer, a GaN layer, an InGaN layer and a GaN layer. After having formed a solid plate mask on this stack, the latter is subjected to the step of sublimation. The GaN layer as well as the layers that cover it are sublimated through the mask. The AlN layer plays the role of a stop layer. It has been demonstrated that using a porous GaN substrate leads to better photoluminescence with respect to a non-porous GaN substrate [6]. The sublimation can be done, for example, in a molecular beam epitaxy (MBE) frame [6] or in a metalorganic vapour phase epitaxy (MOVPE) frame [7]. This method can be implemented on doped or undoped GaN layers. However, all the substrates cannot be used given the temperatures implemented during the sublimation.

Disclosure of the Invention

A purpose of the present invention is to propose a method for obtaining an epitaxial InGaN layer, at least partially and even totally relaxed, from a GaN/InGaN substrate for the purpose of manufacturing, for example, red green blue pixels.

For this, the present invention proposes a method for manufacturing a relaxed epitaxial InGaN layer from a GaN/InGaN substrate comprising the following steps: providing a first stack comprising successively a GaN or InGaN layer to be porosified and a barrier layer, preferably made of AlInN, AlN, GaN or AlGaN, b) transferring the GaN or InGaN layer to be porosified and the barrier layer to a porosification support, the barrier layer being disposed between the porosification support and the GaN or InGaN layer to be porosified, in such a way as to form a second stack, c) forming a mask on the GaN or InGaN layer to be porosified, d) porosifying the GaN or InGaN layer through the mask, whereby a porous GaN or InGaN layer is formed, e) transferring the porous GaN or InGaN layer and the barrier layer to a support of interest, whereby an intermediate substrate is formed, f) forming an InGaN layer by epitaxy on the barrier layer, whereby a relaxed epitaxial InGaN layer is obtained on the intermediate substrate.

The invention is fundamentally distinguished from the prior art by the implementation of a step of porosification of the GaN or InGaN layer through a mask and by the implementation of different steps of transfer. The porosification structure of the surface of the GaN or InGaN layer and makes it possible to improve the extraction effectiveness and makes it possible to incorporate more In by relaxation of the stresses.

The first transfer makes it possible to carry out the step of porosification on the face of the GaN or InGaN layer with nitrogen (N) polarity, the degree of porosification is thus obtained more easily with respect to the Ga-face polarity. The second transfer makes it possible to have the non-porosified barrier layer on the front face of the substrate, for a later resumption of epitaxy. The barrier layer is not porosified during step e). It can therefore be used as a resumption of epitaxy layer. In addition, the substrate used for the porosification is not the final substrate, which allows for a larger choice of substrates of interest.

At the end of the method, a structure of the InGaNOX ("InGaN on Substrate X") type with an undoped InGaN layer is obtained. The method can be carried out solid plate, which simplifies the implementation thereof.

During the resumption of epitaxy, the growth temperature used (typically from 800° C. to 1,000° C., and in particular from 800° C. to 900° C. for InGaN) makes it possible to modify the porosified layer, in particular by enlarging the pores of this layer, which provides an additional degree of freedom while still retaining the lattice parameter adapted to the re-epitaxied layer. At least one partially relaxed InGan layer is thus obtained, and preferably totally relaxed.

According to a first alternative embodiment, step d) is carried out by sublimation through the mask. The porosification by sublimation consists of sublimating the GaN or InGaN layer through the openings of the mask. The size of the pores and the density thereof therefore depend firstly on the dimensions of the mask. The sublimation consists of an annealing at high temperature. It can be done for example in a molecular beam epitaxy frame or in a metalorganic vapour phase epitaxy (MOVPE) frame.

According to this first alternative, the mask is, advantageously, a SiN mask. The SiN mask can be, advantageously, formed in situ. The position of the openings of the mask can be random. Alternatively, the SiN mask can be formed ex situ with a method implementing a step of etching through an organised mask, for example a block copolymer mask. The barrier layer is selective with respect to the (Ga, In)N during the sublimation.

According to another alternative embodiment, the GaN or InGaN layer to be porosified is doped and step d) is carried out electrochemically through the mask.

According to this alternative, the mask is advantageously, made of a polymer material. Preferably, this is a block copolymer. Such a polymer has homogeneous and regularly spaced openings.

According to these different alternative embodiments, the mask formed in step c) can have openings from 10 nm to 50 nm in diameter. For example, openings from 10 nm to 20 nm or openings from 20 nm to 40 nm in diameter will be chosen.

It is easy to adjust the dimensions of the pores of the porous layer according to the openings of the mask, the possible doping of the GaN or InGaN layer, the voltage applied and/or the electrolyte chosen (nature and/or concentration) or the temperature and the duration of sublimation in order to have the relaxation percentage required to reach the desired wavelength.

Advantageously, the mask includes at least one first zone, a second zone and a third zone, the openings of the first zone having a first dimension, the openings of the second zone having a second dimension and the openings of the third zone having a third dimension, whereby during step d) the porous GaN or InGaN layer has a first degree of porosity, a second degree of porosity and a third degree of porosity respectively facing the first zone, the second zone and the third zone. Thus, the concentration in In of the re-epitaxied InGaN layer in each one of the zones will be different, and it is possible to epitaxy a full InGaN LED structure. A single growth step can lead to the obtaining of three colours RG B.

Advantageously, the porosification support and/or the support of interest comprises a support layer, for example made of sapphire, silicon carbine (SiC) or silicon, and a buried oxide layer.

According to a particular embodiment, step b) is, advantageously, carried out according to a method, of the Smart-Cut™ type, comprising the following steps:

implanting atomic species to form an embrittlement zone in the GaN or InGaN layer to be porosified, at a depth close to the final thickness of the layer to be retained in the final substrate, bonding of the first stack on the porosification support, the barrier layer being disposed between the porosification support and the layer to be porosified, providing thermal energy to detach the layer to be porosified from the GaN or InGaN layer at the embrittlement zone.

Advantageously, the first stack provided in step a) further comprises an additional InGaN layer.

According to this embodiment, step b) can be carried out according to two advantageous alternatives.

According to the first advantageous alternative embodiment, step b) includes the following steps:

electrochemical anodising on the additional InGaN layer in order to weaken it, separating the barrier layer and the GaN or InGaN layer and the additional InGaN layer, by thermal activation and/or mechanical action.

According to the second advantageous alternative embodiment, step b) includes a step during which an electrochemical anodising is carried out on the additional InGaN layer until the dissolution thereof, whereby the barrier layer and the GaN or InGaN layer are separated from the additional InGaN layer. The dissolution of the additional InGaN layer can be carried out prior to or after the transfer of the layers to the anodising support.

Advantageously, the method includes a step during which the GaN or InGaN layer is structured, to form GaN or InGaN mesas. Forming mesas makes it possible to introduce an additional degree of relaxation of the InGaN layer that will be epitaxied on the barrier layer, taking advantage of the free edges of the mesas. The structuring in mesas amplifies the phenomenon of relaxation.

The structuring can be carried out before or after the step of porosification.

For example, the method includes, between step b) and step d), a step during which the barrier layer and the GaN or InGaN layer to be porosified are structured, for example by photolithography, to form mesas. The mesas are thus formed before the step of porosification, which makes it possible to porosify the mesas both by the lateral faces of the mesas and by the upper face in contact with the electrolyte solution.

The mesas could be formed during the step of porosification. For this, the mask formed in step c) can be deposited locally on the GaN or InGaN layer to be porosified, whereby, during step d), GaN or InGaN mesas are formed by sublimation of the portions of the GaN or InGaN layer that are not covered by the mask at the same time as the portions covered by the mask are porosified. Advantageously, the mask is deposited ex-situ.

Advantageously, the mesas have a thickness that can range from about ten nanometres to a few micrometres according to the nature of the layer 13 of the mesas. A mesa containing a porous GaN layer 13 has for example a thickness of 500 nm to 2 µm. A mesa containing a porous InGaN layer 13 has for example a thickness of 10 to 200 nm. Advantageously, for mesas of a low thickness (typically less than 100 nm), the density of defects in the mesas is limited despite the high concentration in In.

Advantageously, the method comprises a step during which a step of doping by implantation or by epitaxy in metalorganic vapour phase is carried out, possibly with different dopings, on the GaN or InGaN layer. Advantageously, this step is carried out before step d) of electrochemical porosification. It can be carried out directly on the InGaN or GaN mesas.

It is for example possible to carry out a selective implantation of an n-dopant (such as silicon) or a p-dopant (such as magnesium) to obtain a GaN or InGaN layer or mesas that are more or less doped. This makes it possible to have a structure that is more or less relaxed.

Preferably, an implantation is carried out with an n-type dopant (Si for example) with different dopings from one mesa to another. Pixels are thus obtained, for example three pixels, with different levels of doping and therefore subsequently different relaxation percentages, and thus different transmission wavelengths. This alternative embodiment is advantageous for forming a multi-spectral device, for example LEDs of different colours in a simplified manner or multi-colour micro-displays.

Advantageously, the barrier layer has a thickness less than 3 nm.

Advantageously, the rate of indium present in the InGaN layer is greater than or equal to 8%. This provides a quality re-epitaxy, rich in In.

Advantageously, the method includes a later step during which a LED structure, and in particular a full InGaN red LED structure, is formed on the mesas. As the latter have a lattice parameter in the plane greater than that of the GaN thanks to the relaxation, they will be used as InGaN pseudo-substrate to increase the rate of incorporation of In into the full InGaN LED structure.

This method has many advantages:

it is simple to implement, it can be used for mesas of low or great thicknesses, structuring in mesas provides the compliance effect, it leads to a partial or total relaxation of the stresses, which leads to decreasing the piezo-electrical polarisation in comparison with a stressed layer of the same concentration in In, and especially to incorporating more In for the same growth conditions, it allows for a so-called "bottom up" approach for the manufacture of the µLED and µdisplay: the growth of the optical structures (N, QW, P) is carried out after pixelation in a mesa, regardless of the size of the pixels, and makes it possible to overcome the alignment problems as for the "pick and place" method, there is no impact of the etching method of the pixels on the effectiveness of the micro-LEDs, which makes possible producing a micrometric and even sub-micrometric pixels.

With this method, it is possible to reach 40% In in the wells and an external quantum efficiency (EQE) greater than 2.9% in the red.

The invention also relates to a substrate comprising successively:

a support of interest, comprising, preferably, a support layer, for example made of sapphire, SiC or silicon, and a buried oxide layer, a porous GaN or InGaN layer, possibly doped, the GaN or InGaN layer having, advantageously, a porosity greater than 1%, and preferably, from 5% to 70%, and a barrier layer, preferably made of AlInN, AlN, GaN or AlGaN, possibly an additional InGaN layer.

The barrier layer is not porous.

Such a substrate makes it possible to form a relaxed epitaxial InGaN layer and then to carry out a resumption of growth of a LED structure transmitting in the red. The relaxed InGaN layer favours the incorporation of In and makes it possible to retain good crystalline quality of the InGaN alloy even at a high concentration of In.

The invention also relates to an electroluminescent diode structure comprising successively such a substrate such as defined hereinabove and a re-epitaxied stack, the substrate comprising:

a support of interest, a porous GaN or InGaN layer, possibly doped, and having, advantageously, a porosity greater than 1%, and preferably, from 5% to 70%, a barrier layer, possibly, an additional InGaN layer.

The re-epitaxied stack comprising successively from the barrier layer of the substrate or, where applicable, from the additional InGaN layer:

a relaxed epitaxial InGaN layer doped with a first conductivity type, an active zone with one or more InGaN/(Ga,In)N quantum wells transmitting in the red or in the green, or in the blue in order to obtain the 3 colours via the mesas with different levels of doping, an InGaN layer doped with a second conductivity type, different from the first type of conductivity.

Other characteristics and advantages of the invention will appear in the following supplemental description.

It goes without saying that this supplemental description is given solely for the purposes of illustrating the object of the invention and must not in any way be interpreted as a limitation of this object.

BRIEF DESCRIPTION OF THE DRAWINGS

The present invention shall be better understood when reading the description of embodiments given solely for the purpose of information and in no way limiting in reference to the accompanying drawings wherein.

Figure 1A:
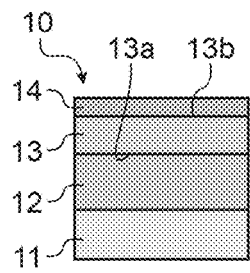
FIGS. 1A to 1G diagrammatically show and as a cross-section, a method for manufacturing a LED structure comprising a relaxed epitaxial InGaN layer, according to a particular embodiment of the invention.

The different portions shown in the figures are not necessarily to a uniform scale, in order to make the figures more legible.

The different possibilities (alternatives and embodiments) must be understood as not being exclusive from one another and can be combined together.

Furthermore, in the description hereinafter, terms that depend on the orientation, such as "above", "below", etc. of a structure apply in considering that the structure is oriented in the way illustrated in the figures.

DETAILED DISCLOSURE OF PARTICULAR EMBODIMENTS

Although this is in no way limiting, the invention has in particular applications in the field of colour micro-displays, and more particularly for the manufacture of red green blue pixels. However, it could be used in the field of photovoltaics or water splitting since, on the one hand, InGaN absorbs in the entire visible spectrum and, on the other hand, its valence and conduction bands are around the stability range of water, thermodynamic conditions that are necessary for the decomposition of water. The invention can also be interesting for the manufacture of LEDs or long wavelength emitting lasers.

The method, making it possible to obtain a substrate or a pseudo-substrate, comprising at least one barrier layer 14 on a porosified GaN or InGaN layer 13, implements a step during which the GaN or InGaN layer 13 is porosified by electrochemical anodising or by sublimation.

It is then possible to carry out a resumption of epitaxy of an InGaN layer on the barrier layer. The epitaxial InGaN layer is at least partially relaxed, even totally relaxed, which allows for the growth of a LED structure.

The relaxation percentage corresponds to:

$$\Delta a/a = (a_{c2} - a_{c1})/a_{c1}$$

with $a_{c1}$, the lattice parameter of the seed layer, and $a_{c2}$ the lattice parameter of the relaxed layer.

The layer is 100% relaxed if $ac_2$ corresponds to the lattice parameter of the solid material.

When $a_{c1} = a_{c2}$ the layer is said to be stressed.

The term "partially relaxed" means a percentage of relaxation greater than 50%.

Several methods for manufacturing a substrate covered with a relaxed epitaxial InGaN layer shall now be described in more detail in reference to the different alternative embodiments shown in FIGS. 1A to 1G, in FIGS. 2A to 2G as well as in FIGS. 3A to 3G.

These different alternative embodiments comprise at least the following steps:

providing a first stack 10 comprising a GaN or InGaN layer to be porosified 13 and a barrier layer 14, preferably made of AlInN, AlN, GaN or AlGaN (FIGS. 1A, 2A, 3A), b) transferring the GaN or InGaN layer to be porosified 13 and the barrier layer 14 to a porosification support 21, the barrier layer 14 being disposed between the porosification support 21 and the GaN or InGaN layer to be porosified 13, in such a way as to form a second stack 20 (FIGS. 1B, 2B, 3B), c) forming a mask 50 on the GaN or InGaN layer to be porosified 13 (FIGS. 1C, 2C, 3C), d) porosifying the GaN or InGaN layer through the mask 50, whereby a porous GaN or InGaN layer 13 is formed, then removing the mask 50 (FIGS. 1D, 2D, 3D), e) transferring the porous GaN or InGaN layer 13 and the barrier layer 14 to a support of interest 31 (FIGS. 1E, 2E, 3E), f) forming an InGaN layer by epitaxy on the barrier layer 14, whereby a relaxed epitaxial InGaN layer is obtained (FIGS. 1F, 2F, 3F), g) preferably, forming a LED structure on epitaxial InGaN layer (FIGS. 1G, 2G, 3G), h) possibly, forming mesas of micrometric size (for example from 1 μm to several tens of micrometres, and preferably from sides of 5 to 10 μm) in order to increase the percentage of relaxation, by relaxation of the free edges of the mesas.

Step h) can be carried out, for example, between step d) and step e) and preferably between step e) and step f).

Figure 2A:
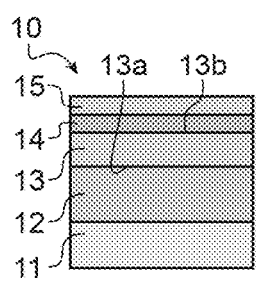
FIGS. 2A to 2G diagrammatically show and as a cross-section, a method for manufacturing a LED structure comprising a relaxed epitaxial InGaN layer according to another particular embodiment of the invention, FIGS. 3A to 3G diagrammatically show and as a cross-section, a method for manufacturing a LED structure comprising a relaxed epitaxial InGaN layer according to another particular embodiment of the invention.
Figure 3A:
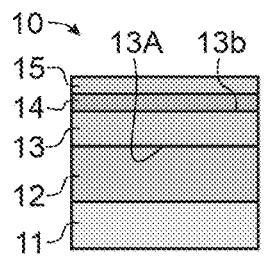

The first stack 10 provided in step a) and, shown in FIGS. 1A, 2A, 3A, preferably comprises an initial substrate 11, a growth layer 12, a GaN or InGaN layer to be porosified 13 and a barrier layer 14.

The initial substrate 11 is for example, made of sapphire, SiC, silicon or glass. The substrate 11 has, for example, a thickness ranging from 350 µm to 1.5 mm.

The GaN 12 growth layer 12 has, for example, a thickness ranging from 30 nm to 4 µm. The GaN layer is, preferably, unintentionally doped. The term "unintentionally doped GaN", means a doping concentration less than $5.10^{17}/cm^3$, for example $1.10^{17}/cm^3$. Alternatively, the growth layer 12 can be made of AlN or AlGaN.

The InGaN or GaN layer to be porosified 13 can be doped, in particular with an n-type doping. It has, for example, a thickness ranging from 10 to 200 nm for InGaN or 800 nm to a few micrometres (for example 2 µm) for GaN. A layer of a lower thickness can contain a high concentration in In while still retaining good material quality (few defects). The term "doped InGaN" means a concentration in electrons comprised between $2.10^{18}$ and $2.10^{18}/cm^3$. The doped InGaN layer 13 is electrically conductive. It is porosified during step d).

The InGaN or GaN layer 13 has two main faces: a first main face 13a and a second main face 13b. The first main face 13a is of nitrogen (N) polarity. It is disposed facing the GaN growth layer 12. The second main face 13b is of Gallium (Ga) polarity. It is disposed in contact with the barrier layer 14.

The barrier layer 14 is preferably made of AlInN, AlN, GaN or AlGaN. A AlInN barrier layer shall for example be chosen.

The barrier layer 14 has, preferably, a thickness less than 3 nm, for example, a thickness of 1 nm. Its concentration in In will have to be adjusted so as to be lattice matched with the GaN or InGaN layer 13. The barrier layer 14 will be used both as a selective layer with respect to the sublimation technique and resumption of epitaxy layer. The sublimation technique will not have any effect on the barrier layer 14. This layer is not porosified during step d). At the end of step d), the barrier layer 14 is not porous (i.e. it has a porosity less than 0.01%, and preferably less than 0.001%). The barrier layer 14 is a non-porosified layer that can be used for the resumption of epitaxy.

According to a first alternative embodiment, shown in FIG. 1A, the first stack 10 is constituted of layers mentioned hereinabove. In other words, it does not include other layers.

Figure 2B:
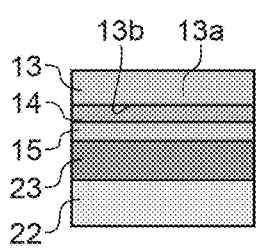
Figure 2D:
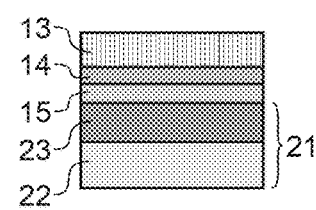
Figure 2E:
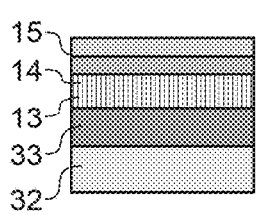
Figure 2F:
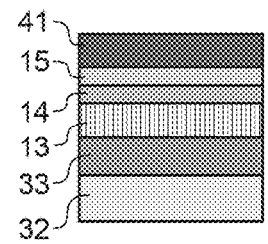
Figure 2G:
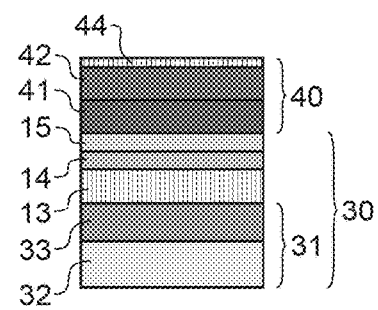
Figure 3B:
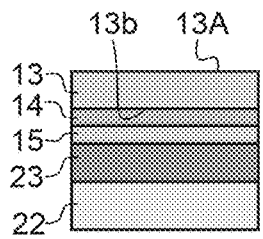

According to an alternative embodiment shown in FIG. 2A or in FIG. 3A, the first stack further comprises an additional InGaN layer 15. This additional layer has a concentration in In greater than or equal to that of the InGaN layer 13, positioned between the GaN growth layer 12 and the barrier layer 14. The growth of this additional layer is carried out on the barrier layer 14. After the first transfer, the additional layer is in contact with the porosification substrate 21 (FIGS. 2B, 3B). It is not porosified during step d) (FIGS. 2D, 3D). After the second transfer, the additional layer 15 is the upper layer of the stack (FIGS. 2E, 3E) and thus the resumption of epitaxy is carried out directly from this layer 15 (FIGS. 2F, 3F). Advantageously, the presence of this layer 15 prevents or limits any problems of surface contamination, between the different steps, due to the presence of Al. In addition, when the additional InGaN layer 15 on the surface of the stack has a concentration in In greater than the layer that will be porosified, a first relaxation can occur after the second transfer and/or after the forming of the mesas.

The layers of the first stack 10 are, advantageously, solid plate deposited on the initial substrate 11.

Figure 1B:
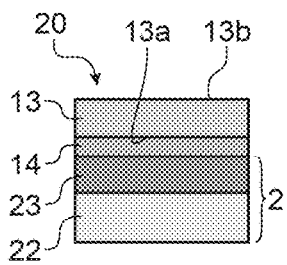

During step b), the barrier layer 14, the InGaN or GaN layer 13, and possibly the additional InGan layer 15 is transferred to a porosification support 21 (FIGS. 1B, 2B, 3B).

The porosification support 21 comprises, advantageously, a support layer 22 and a buried oxide layer 23 referred to as BOX (also sometimes called continuous oxide layer).

The support layer (or support) 22 is, for example, made of sapphire, silicon, silicon carbine or glass. The support layer 22 has, for example, a thickness ranging from 350 µm to 1.5 mm.

The BOX oxide layer 23 has, for example, a thickness ranging from 100 nm to 4 µm.

The free face of the barrier layer 14 or of the additional InGan layer 15 is added, on the porosification support 21, preferably, on the BOX oxide layer 23 of the porosification support 21, via for example a direct or molecular bonding.

According to an advantageous embodiment, this transfer is carried out by the Smart Cut™ technique. For this, the method includes the following steps:

implanting atomic species to form an embrittlement zone in the GaN or InGaN layer to be porosified 13, at a depth close to the final thickness of the layer to be retained in the final substrate;

bonding the first stack 10 on the porosification support 21;

providing thermal energy to detach the InGaN or GaN layer 13 at the embrittlement zone.

The initial substrate 11 and the GaN layer 12 of the first stack 10 are detached from the InGaN/GaN layer 13 by fracture along the plane of the embrittlement zone. The fracture is carried out for example, by thermal treatment in range of temperatures from 400° C. to 600° C. and for a duration ranging from a few minutes to a few hours. This fracture leads to the transfer of the layer to be porosified 13, of the barrier layer 14 and possibly of the additional layer 15 to the porosification support 21.

According to a particular embodiment, the initial substrate 11 and the GaN layer 12 can be detached from the GaN layer 13 by a method of etching a sacrificial intermediate layer for example with a laser (also called the "lift off" technique).

At the end of step b), a second stack 20 is thus obtained comprising successively the support layer 22, the buried oxide layer 23, the barrier layer 14, the InGaN or GaN layer to be porosified 13 (FIGS. 1B, 2B, 3B). The first face 13a of N polarity is thus accessible. The second stack 20 can further comprise the additional InGaN layer 15. The additional layer 15 is positioned between the buried oxide layer 3 and the barrier layer 14.

After the implantation of the Smart Cut™, and before the step of porosification, it is possible to carry out a step of Si implantation to make the InGaN layer 13 electrically conductive or more electrically conductive if this layer is already doped.

During step c), a mask 50 is formed on the layer to be porosified 13. The mask includes a plurality of openings (or pores). The openings can be of identical or different dimensions. Advantageously, their dimensions are identical. The openings can be disposed regularly or randomly. The openings have, for example, a diameter of 10 nm to 20 nm. The openings are, advantageously, circular.

The mask can be formed of a fraction of a mono-layer of material. It has, for example, a thickness comprised between 0.4 and 1 mono-layer.

Figure 1C:
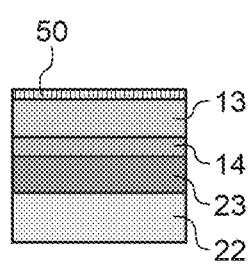
Figure 1D:
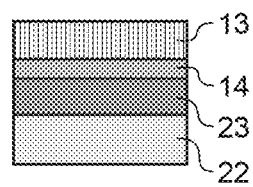
Figure 1E:
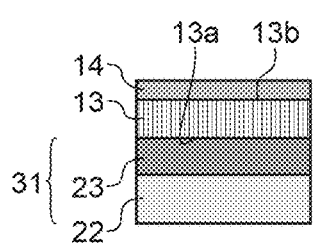
Figure 1F:
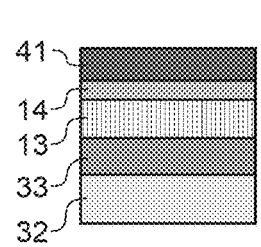
Figure 1G:
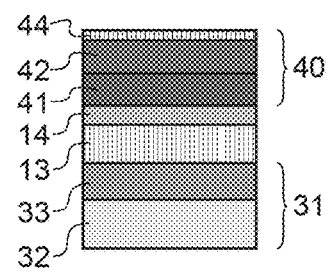
Figure 2C:
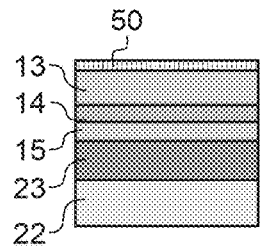

It is possible to form a solid plate mask 50, i.e. of dimensions identical to the underlying layer to be porosified (FIGS. 1C, 2C).

Figure 3C:
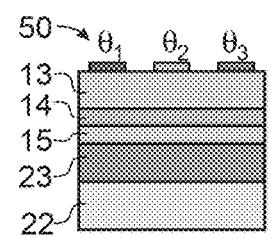
Figure 3D:
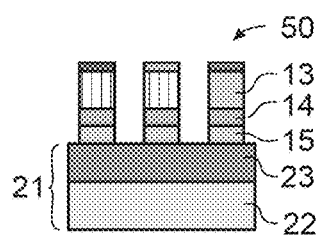
Figure 3E:
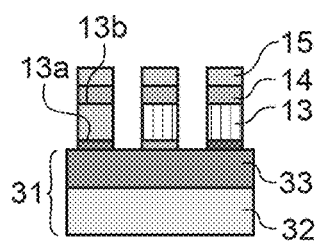
Figure 3F:
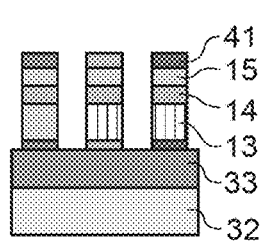
Figure 3G:
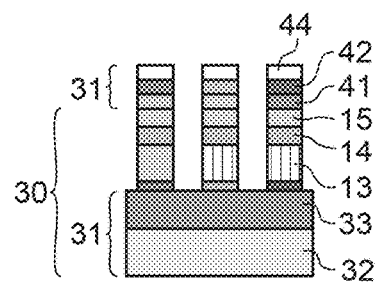

According to a particular embodiment, shown in FIG. 3C, the mask 50 is carried out in such a way as to form three different zones noted as $\theta_1$, $\theta_2$, $\theta_3$, having different rates of coverage. The dimensions of the nanomasking of each one of the three zones will control the degree of porosity of each zone during the step of sublimation.

The nature of the mask 50 is chosen according to the technique used for the porosification.

For a porosification by sublimation, a SiN mask 50 will advantageously be chosen. Such a mask can be formed in situ or ex situ, via an intermediate masking with an additional mask, for example made of polymer material. In the case of a masking ex situ, the SiN mask has, advantageously, a thickness greater than 1 mono-layer. Preferably, the additional mask is a block copolymer film. A block copolymer film has a large number of openings (or pores) of small dimensions. Advantageously, the openings have the same dimensions and/or are regularly spaced, which leads, advantageously, to the obtaining of a GaN/InGaN layer of organised porosity. Advantageously, such a mask is formed quickly. For example, the block copolymer is poly(styrene-blockmethyl methacrylate) also noted as PS-b-PMMA.

The mask 50 is etched facing openings of the additional mask in order to form the openings of the mask 50.

Advantageously at the end of step c), the additional copolymer film is removed before the porosification by sublimation.

For a porosification electrochemically, a mask 50, preferably made of polymer, will be chosen. For example, the mask 50 is a block copolymer film. Preferably, the block copolymer is PS-b-PMMA.

Alternatively, it is possible to use a porous alumina mask 50. The nanoporous alumina mask 50 can be obtained by structuring a sheet of aluminium thanks to different steps of oxidation and of etching. The nano-pores of the alumina mask 50 advantageously have a diameter between 15 and 400 nm, for example 80 nm, and a pitch between 50 nm and 400 nm, for example of about 100 nm. The thickness of the alumina mask 50 is for example 250 nm.

During step d), the GaN or InGaN layer 13 is porosified by sublimation or electrochemically.

To carry out the porosification by sublimation, a molecular beam epitaxy (MBE) frame or a metalorganic vapour phase epitaxy (MOVPE) frame can be used for example. Epitaxy by MBE allows for a control in situ of the growth, to the nearest mono-layer. Porosification by sublimation advantageously leads to the obtaining of well-defined pores, and in particular of cylindrical shape. The lateral wall of the pores is perpendicular to the main faces 13a, 13b of the layer 13.

Temperatures from 800° C. to 900° C. for the vacuum MBE sublimation will for example be chosen. The higher the temperature is, the higher the sublimation speed is.

The barrier layer 14 plays the role of a stop layer of the sublimation. This layer is not sublimated. It protects the underlying layers during the porosification. It plays the role of a barrier layer or of a stop layer. In particular, in the case of a first stack comprising an additional InGaN layer 15, the latter is protected by the barrier layer 14 during the sublimation.

With this porosification technique, the GaN or InGaN layer 13 can be doped or undoped.

To carry out the porosification electrochemically, the layer to be porosified has to be electrically conductive. A doped GaN or doped InGaN layer will therefore be chosen. The porosification is applied on the N face of the GaN or InGaN layer on the surface. Advantageously, the porosification by the N face leads to a more substantial porosification (porosity rate, shape of the pores).

Step c) comprises, for example, the following sub-steps:
connecting the doped GaN or InGaN layer 13 and a counter-electrode to a voltage or current generator,
plunging the second stack 20 and the counter-electrode in an electrolyte solution,
applying a voltage or a current, between the doped GaN or InGaN layer 13 and the counter-electrode in such a way as to porosify the doped GaN or InGaN layer 13.

The second stack 20 plays the role of working electrode (WE).

The counter-electrode is made of an electrically conductive material. The material of the counter-electrode will be chosen so as to not be able to form oxidisable by-products during the cathodic reaction, so as to not induce any modification of the electrolyte during the porosification. A metal such as platinum shall, for example, be chosen.

During step d), the electrodes are plunged in an electrolyte, also called electrolytic bath or electrolyte solution. The electrolyte can be an acid or a base. The electrolyte is, for example, oxalic acid. It can also be KOH, HF, $HNO_3$ or $H_2SO_4$.

A voltage is applied between the device and the counter-electrode. The voltage can range from 1 V to 100V, preferably from 3 V to 100 V. It is applied, for example, for a duration ranging from a few seconds to a few hours. The anodising reaction is finished when, with an imposed potential, the current becomes zero: in this case there is no longer any transfer of charges and the electrochemical reaction stops.

The step of electrochemical anodising can be carried out under ultraviolet light (UV). The method can also include a first electrochemical anodising without adding ultraviolet radiation and a second electrochemical anodising by adding ultraviolet radiation.

Advantageously, the porosification takes place in all the volume of the doped GaN or InGaN layer 13.

At the end of the step of porosification d), the porosity rate of the doped GaN or InGaN layer 13 is at least 1%. It ranges preferably from 5% to 70%.

The largest dimension (the height) of the pores can vary from a few nanometres to a few micrometres. The smallest dimension (the diameter) can vary from a few nanometres to a hundred nanometres, in particular from 10 nm to 70 nm, for example from 10 to 20 nm or from 30 to 70 nm, and preferably from 15 nm to 40 nm.

The porosification obtained (porosity rate and side of the pores) depends on the geometry of the mask 50, possibly the doping of the GaN or InGaN layer 13 and of the parameters of the method (voltage applied, duration, nature and concentration of the electrolyte for the porosification electrochemically or duration and temperature for the sublimation). The variation in the porosification makes it possible to control the rate of incorporation/segregation of the In. The porosification, and in particular, the side of the pores, can vary later, during the resumption of epitaxy according to the temperature applied.

During step e), the second stack 20 comprising the porosified GaN or InGaN layer 13, the barrier layer 14, and possibly, the additional layer 15, is then transferred to the support of interest 31 (FIGS. 1E, 2E, 3E) in order to have the second face 13b of metal polarity (Gallium) on the front face. The support of interest 31 comprises, for example, a support layer 32 preferably made of Si, SiC, glass or sapphire, and a BOX oxide layer 33. An oxide that can support high-temperature epitaxy (at least 950° C.) shall be chosen.

At the end of the method a substrate 30 of the InGaNOX ("InGaN on substrate X") type is thus obtained comprising from the rear face to the front face (FIGS. 1E, 2E, 3E):

a support of interest 31, preferably, formed from a support layer 32, for example made of sapphire, and a BOX oxide layer 33, a GaN or InGaN layer 13, porosified, with a Ga polarity on the front face, a barrier layer 14, non-porous, and possibly an additional InGaN layer 15.

At the end of step e), the barrier layer 14 or the additional InGan layer 15 is found on the front face. These layers are dense (i.e. they are not porous).

During step f), an InGaN layer is formed by resumption of epitaxy. The barrier layer 14 and/or the additional InGaN layer 15 is a continuous non-porous 2D layer since it is not porosified during the step of electrochemical anodising or of sublimation. The barrier layer 14 or the additional layer 15 will make it possible to resume the epitaxy with an InGaN layer with a concentration in In greater than the GaN or InGaN layer underneath. The growth of the re-epitaxied stack 40 is thus facilitated and the epitaxial layer has a better crystalline quality.

The surface InGaN layer will guide the deformation of the porous layer by its concentration in In and its thickness. The porous layer can be led to be deformed in such a way that the InGaN surface layer can be relaxed. Rates of relaxation of about 70%, and even more can advantageously be obtained.

According to an advantageous alternative embodiment, the method can also include a step during which the InGaN or GaN layer and the barrier layer 14 are structured to form mesas (step h).

Mesas, also called elevations, are elements in relief. They are obtained, for example, by etching a continuous layer or several superimposed continuous layers, in such a way as to leave only a certain number of "reliefs" of this layer or of these layers. The etching is generally a plasma or dry etching (ex: plasma RIE). The reliefs make it possible to define pixels.

Preferably, the flanks of the mesas are perpendicular to the stack of the different layers of the substrate 30.

The dimensions (width and length) of the mesas range from 500 nm to 500 µm. The terms "width and length" means the dimensions parallel to the surface of the underlying stack. Dimensions less than or equal to 10 µm×10 µm will in particular be chosen.

The spacing ("pitch") between two consecutive mesas 100 can be comprised between 50 nm and 20 µm.

The mesas comprise the InGaN or GaN layer 13, the barrier layer 14 and possibly the additional layer 15.

The thickness of the mesas depends in particular on the thickness of the InGaN or GaN layer 13. For example, for a porous GaN layer 13, the height of the mesa can be 700 nm (500 nm porous GaN+200 nm non-porous InGaN). The term "thickness" means the dimension of the mesa perpendicular to the underlying stack.

The mesas are formed, advantageously, before the growth of the LED structure, and even more advantageously before the resumption of epitaxy.

According to an advantageous alternative embodiment the mesas are, advantageously, formed after the step of porosification.

According to an advantageous alternative embodiment, the mesas can be formed before the step of porosification. For example, after the step of masking (step c), a lithography can then be carried out in order to obtain mesas. It is, in particular advantageous to form a mesa per zone $\theta 1$, $\theta 2$, $\theta 3$ of nanomask. Preferably, a single step of sublimation is carried out for the 3 zones.

According to another alternative embodiment, the mesas are formed before or after the resumption of epitaxy of the InGaN layer.

The mesas can be structured then doped. According to this alternative embodiment, the method can include, before the step of porosification, the following steps:

structuring the InGaN or GaN layer 13 and the barrier layer 14, solid plate deposited, to form mesas, advantageously, filling the space between the mesas with an adapted material and planarizing the assembly thus obtained in order to have a flat surface, locally implant a dopant in the mesas at the same concentration or at different concentrations; it is for example possible to carry out several implantations with different sets of masks.

Alternatively, the doping can be carried out prior to the structuring of the mesas. According to this alternative embodiment, the method can include, before the step of porosification, the following steps:

locally implanting a dopant in the InGaN or GaN layer 13 solid plate deposited, the concentration in dopant able to vary along the layer in such a way as to form zones that are more or less doped, structuring the InGaN or GaN layer 13 and the barrier layer 14, solid plate deposited, to form mesas.

For the purposes of illustration, it is, for example, possible to use a hard mask, such as a mask of the SiN or $SiO_2$ type, to carry out the implantation and alignment marks (for example made of Al, Ti, TiN) to have the mesas and the implanted zones correspond. With two different masks, two zones with different implantation energies can be carried out, and therefore two different dopings in addition to the initial doping of the doped plate, for example by MOCVD. The alignment marks make it possible to align the two masks for the implantation and the mask for the etching of mesas.

The same mask set will be used for the implantation and the mesas.

The structuring of the mesas can be carried out by photolithography.

Alternatively, the implant doping can be replaced with a doping by epitaxy in metalorganic vapour phase (MOCVD), with Si or Ge as a dopant in particular. It is, for example, possible to carry out three successive epitaxy steps to obtain 3 different levels of doping so as to form at the end of the method blue, green and red mesas (RGB).

Preferably, the method includes a later step during which a LED structure is formed on the epitaxial InGaN layer (step g).

This step is advantageously carried out to form re-epitaxied LEDs, in particular full InGaN red (or green) LEDs.

The LED structure is advantageously carried out on the mesas. As the latter have a lattice parameter in the plane greater than that of the GaN thanks to the relaxation, they will be used as an InGaN pseudo-substrate to increase the rate of incorporation of In in the full InGaN LED structure. This will also make it possible to retain good crystalline quality despite the high content in In.

More advantageously, the resumption of epitaxy is carried out on mesas having different degrees of porosity. During this step, the concentration in In of the re-epitaxied InGaN layer in each one of the zones will vary because the rate of relaxation of each one of the mesas was already different before the resumption of epitaxy (for example if the additional InGaN layer 15 disposed on the barrier layer 14 has a concentration in In greater than the porosified layer). Then, it is possible to epitaxy the full InGaN LED structure. The concentration in In of the different layers of the structure will be guided by the rate of relaxation. Thus, if each one of the mesas has the suitable lattice parameter, a single growth step makes it possible to obtain the three colours RGB, each mesa having a colour. The lattice parameters required are: 3.184 Å for blue, 3.200 Å for green, and 3.238 Å for red.

The re-epitaxied stack 40 of a full InGaN LED comprises, for example, successively from the barrier layer 14 or, where applicable from the additional InGaN layer 15:

an n-doped $In_xGa_{1-x}N$ layer 41 (simple layer or as an InGaN/GaN super lattice structure), preferably of the same concentration in In as the InGaN layer of the relaxed substrate, an active zone 42 with one or more quantum wells $In_yGa_{1-y}N/In_xGa_{1-x}N$ (generally 5), transmitting in the red (or blue or green to obtain in the end the 3 colours RGB), an electron barrier 43 with a p-doped GaN or AlGaN base (×Al~10%), a p-doped $In_xGa_{1-x}N$ layer 44, preferably of the same concentration in In as the n-InGaN layer or less, a p++ doped InGaN layer 45, preferably of the same concentration in In as the p-InGaN layer.

More particularly, a full InGaN LED structure can comprise successively:

an InGaN substrate, an n-doped InGaN layer of 350 nm, formed of $15 \times In_{0.03}Ga_{0.97}N/GaN$ (thicknesses 20 nm/1.8 nm), multiple quantum wells (MQWs), formed of $5 \times In_{0.40}Ga_{0.60}N/In_{0.03}Ga_{0.097}N$ (thicknesses 2.3 nm/5, 7, 11 nm), a nid $In_{0.03}Ga_{0.97}N$ layer (10 nm), a $Al_{0.1}Ga_{0.9}N$:Mg layer (20 nm), an Mg-doped $In_{0.03}Ga_{0.97}N$ layer (125 nm), a p+++ doped $In_{0.03}Ga_{0.97}N$ layer (25 nm).

Different growth methods can be used to form epitaxial layers.

According to a first alternative embodiment, the resumption of growth is lateral and a later step of pixelation by etching is advantageously carried out.

According to another alternative embodiment, the resumption of growth is done vertically above the mesas. In this alternative, the pixels correspond to the underlying mesas.

Advantageously, a passivation layer will be deposited on the flanks of the mesas and/or re-epitaxied LEDs for example by atomic layer deposition (ALD). The passivation layer can be made of alumina. The passivation layer can have a thickness of a few nanometres, for example from 2 to 5 nm.

A technological method will finally be applied for the manufacture of micro-LEDs. The micro-LEDs can be the initial size of the mesas.

Figure 4A:
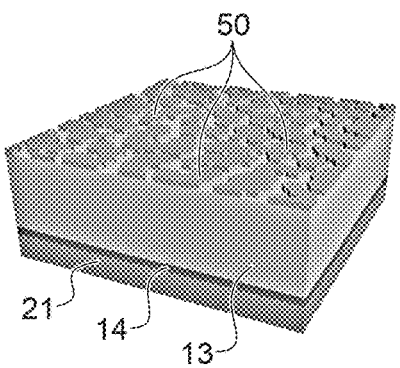
FIGS. 4A and 4B diagrammatically show and in three dimensions different steps of a method of sublimation of a GaN layer through a $Si_XN_Y$ mask, the GaN layer situated over an AlN barrier layer added onto a silicon porosification substrate (111) according to a particular embodiment of the invention.
Figure 4B:
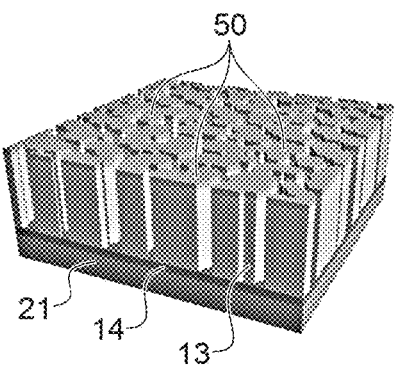

Non-limiting example for the purposes of information:

FIG. 4A diagrammatically shows a GaN layer to be porosified by sublimation. The GaN layer is on a substrate comprising a silicon support and a AlN barrier layer. A nanomasking is carried out in-situ by depositing SiN. The porosification is done through the holes of the mask thanks to a step of vacuum sublimation. FIG. 4B diagrammatically shows the sample after porosification by sublimation through the SiN mask.

Figure 5:
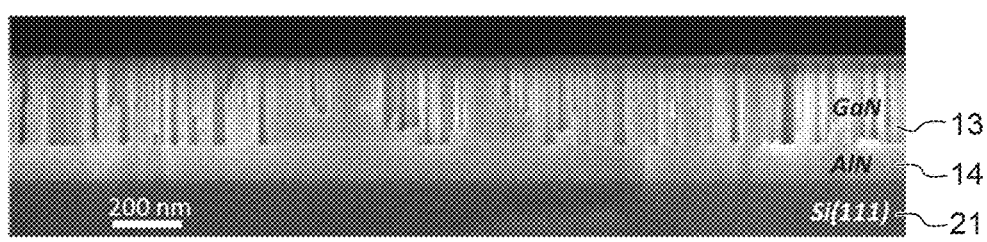
FIG. 5 is an SEM picture of a porosified GaN layer through a $Si_XN_Y$ mask, the GaN layer situated over a barrier layer added onto a silicon porosification substrate (111) according to a particular embodiment of the invention.
Figure 6D:
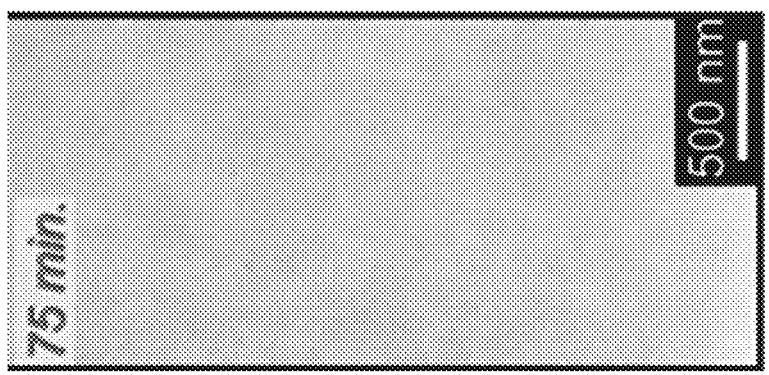
FIGS. 6A to 6D are pictures obtained with a SEM showing nanomasks formed by exposing the GaN surface to a flux of Si for 5 min, 10 min, 20 min and 75 min and subjected to the same sublimation conditions. The more the deposition time of the nanomask increases, the higher the rate of coverage in $Si_XN_Y$ is. For the highest time, the rate of coverage is greater than 1, the GaN surface is entirely covered with $Si_XN_Y$.
Figure 6C:
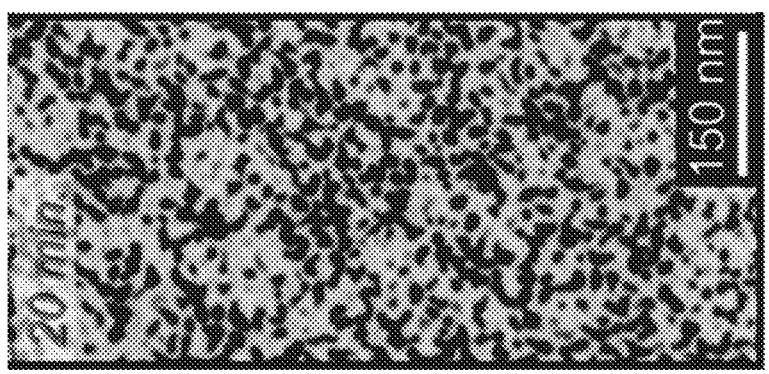
Figure 6B:
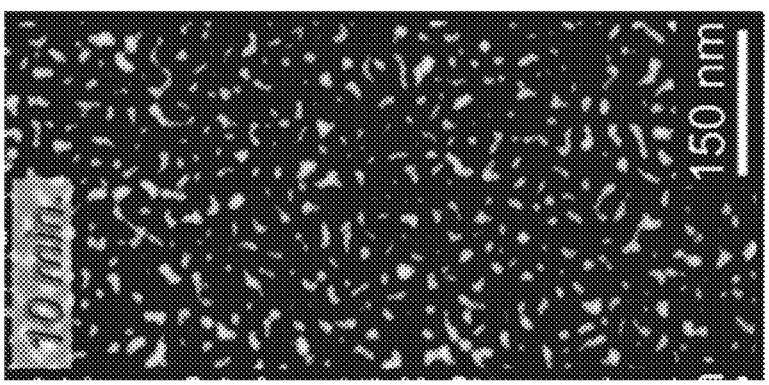
Figure 6A:
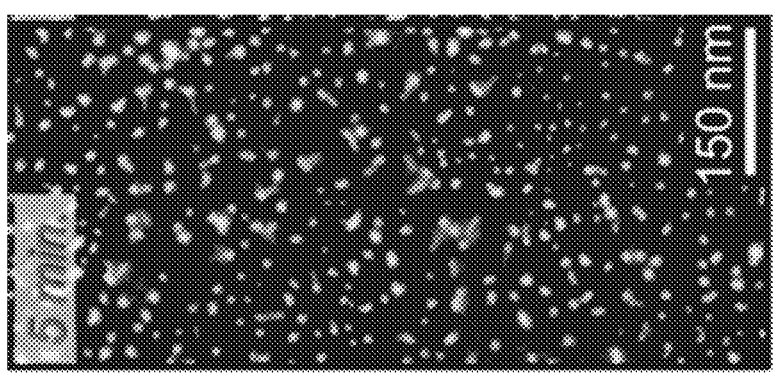

A characterisation by scanning electron microscope (SEM) confirms that the porosification was indeed carried out (FIG. 5). The AlN layer is intact: it was not porosified.

FIGS. 6A to 6D show the influence of the rate of coverage of the SiN nanomasking in-situ (from 0 to 1 mono-layer) on the porosity rate of a GaN layer after the step of sublimation.

REFERENCES

[1] A. Even et al., "Enhanced In incorporation in full InGaN heterostructure grown on relaxed InGaN pseudo-substrate", Appl. Phys. Lett. 110, 262103 (2017).

[2] S. Pasayat et al., "Compliant Micron-Sized Patterned InGaN Pseudo-Substrates Utilizing Porous GaN", Materials 13, 213 (2020).

[3] S. Pasayat et al., "Demonstration of ultra-small (<10 μm) 632 nm red InGaN micro-LEDs with useful on-wafer external quantum efficiency (>0.2%) for minidisplays", Appl. Phys. Exp. 14, 011004 (2021).

[4] EP 3 840 065 A1.

[5] EP 3 840 016 A1.

[6] B. Damilano, et al., "Photoluminescence properties of porous GaN and (Ga,In)N/GaN single quantum well made by selective area sublimation," Optics Express 25, 33243 (2017).

[7] P.-M. Coulon, P. Feng, B. Damilano, S. Vézian, T. Wang, and P. A. Shields, "Influence of the reactor environment on the selective area thermal etching of GaN nanohole arrays," Scientific Reports 10, (2020). https://doi.org/10.1038/s41598-020-62539-1.

The invention claimed is:

1. A method for manufacturing a relaxed epitaxial InGaN layer from a GaN/InGaN substrate comprising the following steps:
   a) providing a first stack comprising successively a GaN or InGaN layer to be porosified and a barrier layer,
   b) transferring the GaN or InGaN layer to be porosified and the barrier layer to a porosification support, the barrier layer being disposed between the porosification support and the GaN or InGaN layer to be porosified, in such a way as to form a second stack,
   c) forming a mask on the GaN or InGaN layer to be porosified,
   d) porosifying the GaN or InGaN layer through the mask, whereby a porous GaN or InGaN layer is formed,
   e) transferring the porous GaN or InGaN layer and the barrier layer to a support of interest, the porous GaN or InGaN layer being disposed between the support of interest 31 and the barrier layer, whereby an intermediate substrate is formed,
   f) forming an InGaN layer by epitaxy on the intermediate substrate, whereby a relaxed epitaxial InGaN layer is obtained on the intermediate substrate.

2. The method according to claim 1, wherein step d) is carried out by sublimation through the mask.

3. The method according to claim 1, wherein the layer to be porosified is doped and wherein step d) is carried out electrochemically through the mask.

4. The method according to claim 3, wherein the mask is made of a polymer material.

5. The method according to claim 1, wherein the mask formed in step c) has openings 20 nm to 40 nm in diameter.

6. The method according to claim 1, wherein the porosification support or the support of interest comprises a support layer and a buried oxide layer.

7. The method according to claim 1, wherein the first stack provided in step a) further comprises an additional InGaN layer covering the barrier layer and wherein during step b), the additional InGaN layer is disposed between the porosification support and the barrier layer.

8. The method according to claim 1, wherein the method comprises an additional step during which on a step of doping by implantation or by epitaxy in metalorganic vapour phase is carried out on the GaN or InGaN layer.

9. The method according to claim 1, wherein the mask formed in step c) is deposited locally on the GaN or InGaN layer to be porosified, whereby, during step d), GaN or InGaN mesas are formed.

10. The method according to claim 1, wherein the mask present includes at least one first zone, a second zone and a third zone, the openings of the first zone having a first dimension, the openings of the second zone having a second dimension and the openings of the third zone having a third dimension, whereby during step d) the porous GaN or InGaN layer has a first degree of porosity, a second degree of porosity and a third degree of porosity respectively facing the first zone, the second zone and the third zone.

* * * * *